(12) United States Patent
Nishida et al.

(10) Patent No.: US 11,657,790 B2
(45) Date of Patent: May 23, 2023

(54) OPERATION DETECTION DEVICE FOR KEY OPERATION OF KEYBOARD DEVICE, OPERATION DETECTION METHOD OF KEY OPERATION, AND KEYBOARD DEVICE

(71) Applicant: YAMAHA CORPORATION, Hamamatsu (JP)

(72) Inventors: Kenichi Nishida, Hamamatsu (JP); Harumichi Hotta, Hamamatsu (JP); Jun Ishii, Hamamatsu (JP)

(73) Assignee: YAMAHA CORPORATION, Hamamatsu (JP)

(*) Notice: Subject to any disclaimer, the term of this patent is extended or adjusted under 35 U.S.C. 154(b) by 0 days.

(21) Appl. No.: 17/741,679

(22) Filed: May 11, 2022

(65) Prior Publication Data

US 2022/0270579 A1 Aug. 25, 2022

Related U.S. Application Data

(63) Continuation of application No. PCT/JP2020/043484, filed on Nov. 20, 2020.

(30) Foreign Application Priority Data

Nov. 20, 2019 (JP) .............................. JP2019-209549

(51) Int. Cl.
*G10H 1/34* (2006.01)
*G01D 5/20* (2006.01)
(Continued)

(52) U.S. Cl.
CPC ........... *G10H 1/344* (2013.01); *G01D 5/2073* (2013.01); *G10B 3/12* (2013.01); *G10C 3/12* (2013.01);
(Continued)

(58) Field of Classification Search
CPC ............. G10H 1/344; G10H 2220/221; G10H 2220/275; G01D 5/2073; G10B 3/12; G10C 3/12
See application file for complete search history.

(56) References Cited

U.S. PATENT DOCUMENTS

| 4,580,478 A | * | 4/1986 | Brosh .................. G10H 1/0555 984/319 |
| 5,107,748 A | * | 4/1992 | Muramatsu .......... G10H 1/0555 341/32 |

(Continued)

FOREIGN PATENT DOCUMENTS

| JP | H03163499 A | 7/1991 |
| JP | 4375302 B2 | 12/2009 |
| WO | 2019122867 A1 | 6/2019 |

OTHER PUBLICATIONS

International Search Report issued in Intl. Appln. No PCT/JP2020/043484 dated Dec. 22, 2020. English translation provided.
(Continued)

*Primary Examiner* — Robert W Horn
(74) *Attorney, Agent, or Firm* — Rossi, Kimms & McDowell LLP

(57) ABSTRACT

An operation detection device for a key operation of a keyboard device includes a conductive unit configured to be disposed on each of keys, a substrate configured to be disposed facing each of the keys in a pressing direction of the keys. The substrate is provided with a sensor including at least first and second coils, the sensor being configured to be disposed spaced from one key so that at least one of the first or second coil outputs a signal corresponding to a distance between the one key and the respective sensor. The operation detection device includes a detection unit configured to detect a displacement of the one key in at least one of a yaw direction or a roll direction based on signals output (Continued)

from the first and second coils during a key pressing stroke of the one key.

19 Claims, 11 Drawing Sheets

(51) Int. Cl.
  *G10B 3/12* (2006.01)
  *G10C 3/12* (2006.01)
(52) U.S. Cl.
  CPC . *G10H 2220/221* (2013.01); *G10H 2220/275* (2013.01)

(56) References Cited

U.S. PATENT DOCUMENTS

| | | | | |
|---|---|---|---|---|
| 5,187,315 | A * | 2/1993 | Muramatsu | G10H 1/0555 84/688 |
| 8,319,089 | B2 * | 11/2012 | Morong | G10H 1/344 84/746 |
| 8,933,314 | B2 * | 1/2015 | Clark | G10H 1/0555 84/626 |
| 2020/0320966 | A1 * | 10/2020 | Clark | H03K 17/972 |
| 2021/0151020 | A1 * | 5/2021 | Tanoue | H03K 17/97 |
| 2022/0057236 | A1 * | 2/2022 | Ishii | G01D 5/2026 |
| 2022/0270579 | A1 * | 8/2022 | Nishida | G10H 1/344 |
| 2022/0270580 | A1 * | 8/2022 | Ishii | G10H 1/0558 |
| 2022/0277717 | A1 * | 9/2022 | Miyoshi | H03K 17/972 |
| 2022/0277718 | A1 * | 9/2022 | Miyoshi | G10H 1/0555 |
| 2023/0013774 | A1 * | 1/2023 | Ishii | G10H 1/0008 |
| 2023/0046476 | A1 * | 2/2023 | Nishida | G10H 1/34 |

OTHER PUBLICATIONS

Written Opinion issued in Intl. Appln. No. PCT/JP2020/043484 dated Dec. 22, 2020.

* cited by examiner

OPERATION DETECTION DEVICE FOR KEY OPERATION OF KEYBOARD DEVICE, OPERATION DETECTION METHOD OF KEY OPERATION, AND KEYBOARD DEVICE

CROSS-REFERENCE TO RELATED APPLICATIONS

This is a continuation of International Application No. PCT/JP2020/043484 filed on Nov. 20, 2020, and claims priority from Japanese Patent Application No. 2019-209549 filed on Nov. 20, 2019, the entire content of which is incorporated herein by reference.

TECHNICAL FIELD

The present disclosure relates to an operation detection device for a key operation of a keyboard device, an operation detection method of a key operation, and a keyboard device including the operation detection device.

BACKGROUND ART

In the related art, there is known a keyboard instrument in which two pressure-sensitive sensors are disposed on a frame in a key arrangement direction for each key, and sound is controlled based on a difference or a sum of outputs of the two sensors (JP-B-4375302). In this keyboard instrument, two sensors are used as horizontal sensors, for example, sound control such as pitch bend and portamento is performed based on a difference between the two sensors, and sound volume is controlled based on a sum of the two sensors. A key pressing operation is detected by a key switch.

However, in JP-B-4375302, a contact type sensor is used, and the lateral swing (yaw, roll) of the key cannot be detected unless the key is in the key pressing end stage.

On the other hand, as a non-contact type sensor, there is known a keyboard device in which a resonance circuit having a coil is provided on each of a key and a substrate, and a position and a speed of the key are detected based on a signal output from the resonance circuit provided on the substrate (WO 2019/122867A1). The resonance circuit of WO 2019/122867A1 can detect the position and speed of the key in a key pressing direction. However, the resonance circuit is not possible to detect the lateral swing (displacement in a yaw direction or a roll direction) of the key.

SUMMARY OF INVENTION

An object of the present disclosure is to provide an operation detection device for a key operation of a keyboard device capable of detecting a displacement of a key in a yaw direction or a roll direction even in the middle of a key pressing stroke of the key.

Aspect of non-limiting embodiments of the present disclosure relates to provide an operation detection device for a key operation of a keyboard device, the operation detection device including:

a conductive unit configured to be disposed on each of a plurality of keys;

a substrate configured to be disposed facing each of the plurality of keys in a pressing direction of the plurality of keys, and provided with:

a sensor comprising at least first and second coils, the sensor being configured to be disposed spaced from one key, among the plurality of keys, so that at least one of the first or second coil outputs a signal corresponding to a distance between the one key and the respective sensor, in a state where the conductive unit is disposed on the one key and the respective substrate is disposed facing the one key; and a detection unit, including a processor, configured to detect a displacement of the one key in at least one of a yaw direction or a roll direction based on signals output from the first and second coils during a key pressing stroke of the one key.

Another aspect of non-limiting embodiments of the present disclosure relates to provide an operation detection method of a key operation of a keyboard device including:

a plurality of keys; and
a conductive unit disposed on each of the plurality of keys;

a substrate disposed facing each of the plurality of keys in a pressing direction of the plurality of keys, and provided with:

a sensor comprising at least first and second coils, the sensor being disposed spaced from one key, among the plurality of keys, so that at least one of the first or second coils outputs a signal corresponding to a distance between the one key and the respective sensor, where the detection method includes detecting a displacement of the one key in at least one of a yaw direction or a roll direction based on signals output from the first and second coils in a key pressing stroke of the one key.

According to an embodiment of the present disclosure, a displacement of the key in the yaw direction or the roll direction can be detected even during key pressing.

DESCRIPTION OF EMBODIMENTS

Hereinafter, embodiments of the present disclosure will be described with reference to the drawings.

Figure 1:
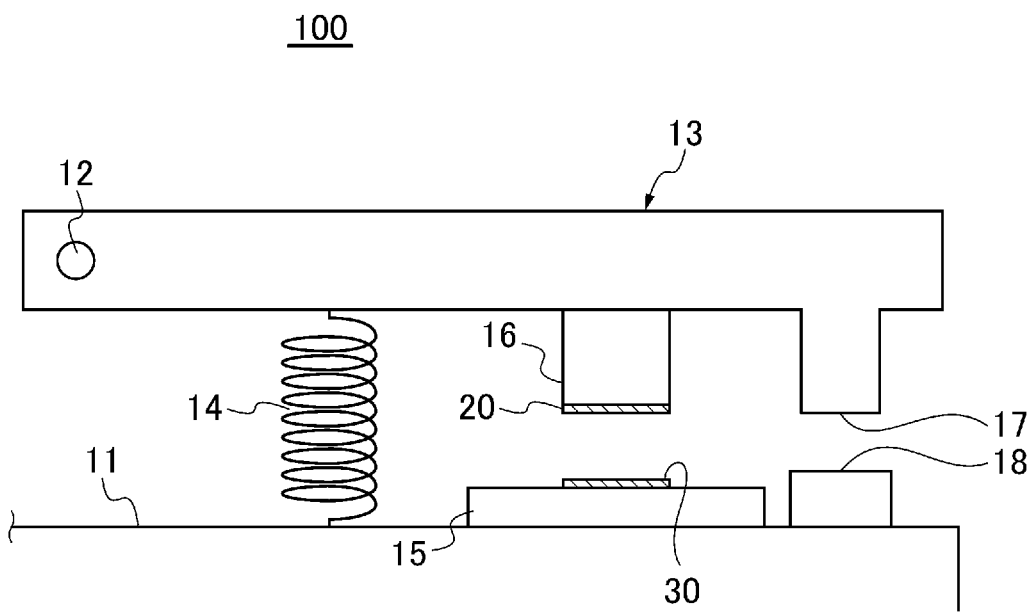
FIG. 1 is a schematic side view of a keyboard device.

FIG. 1 is a schematic side view of a keyboard device to which an operation detection device of a key according to an embodiment of the present disclosure is applied. FIG. 1 is a diagram focusing on one key 13 among a plurality of keys 13 in a keyboard device 100. In FIG. 1, a front end side of the key 13 in a longitudinal direction is a front side, and a key pressing surface (front surface) side is an upper side. The left-right direction is referred to as a direction as viewed from the front side of the key 13 on which a player is located. Therefore, the key arrangement direction is the same as the left-right direction. The keyboard device 100 is suitable for application to an electronic keyboard instrument, and is also suitable as a device that outputs a sound signal without emitting sound.

The key 13 is pivotable in the upper-lower direction around a fulcrum 12 fixed to a frame 11. The key 13 includes a protrusion portion 16 and a protrusion portion 17. A key-side conductive unit 20, which will be described later, is provided at a front end (lower end) of the protrusion portion 16. A circuit substrate 15 is provided on the frame 11. The circuit substrate 15 is provided so as to face each of the keys 13 in a pressing direction of the plurality of keys 13. A plurality of sensor units 30, which will be described later, are disposed on the circuit substrate 15 so as to correspond to the key-side conductive unit 20, respectively.

A coil spring 14 is attached in a compressed state between the key 13 and the frame 11. The coil spring 14 always pushes the key 13 upward. A lower limit stopper 18 facing the protrusion portion 17 is provided on the frame 11. The key 13 in a non-operated state is restricted to an initial position (non-pressing position) shown in FIG. 1 by coming into contact with an upper limit stopper (not shown). When the key 13 is pressed by the player, the coil spring 14 is compressed and the protrusion portion 17 contacts the lower limit stopper 18. A lower limit position of a key pressing stroke of the protrusion portion 17 is restricted by the lower limit stopper 18. The lower limit stopper 18 is elastically deformable within a predetermined range, and is elastically deformed by being pressed by the protrusion portion 17. A position where the lower limit stopper 18 is elastically deformed by a predetermined range is the lowest limit position of the key pressing stroke of the protrusion portion 17. A stopper for defining the lowest limit position may be provided separately from the lower limit stopper 18. When the player releases the key 13 from the key pressing end state in which the protrusion portion 17 presses the lower limit stopper 18, the key 13 is returned to the initial position by a force of the coil spring 14.

Figure 3:
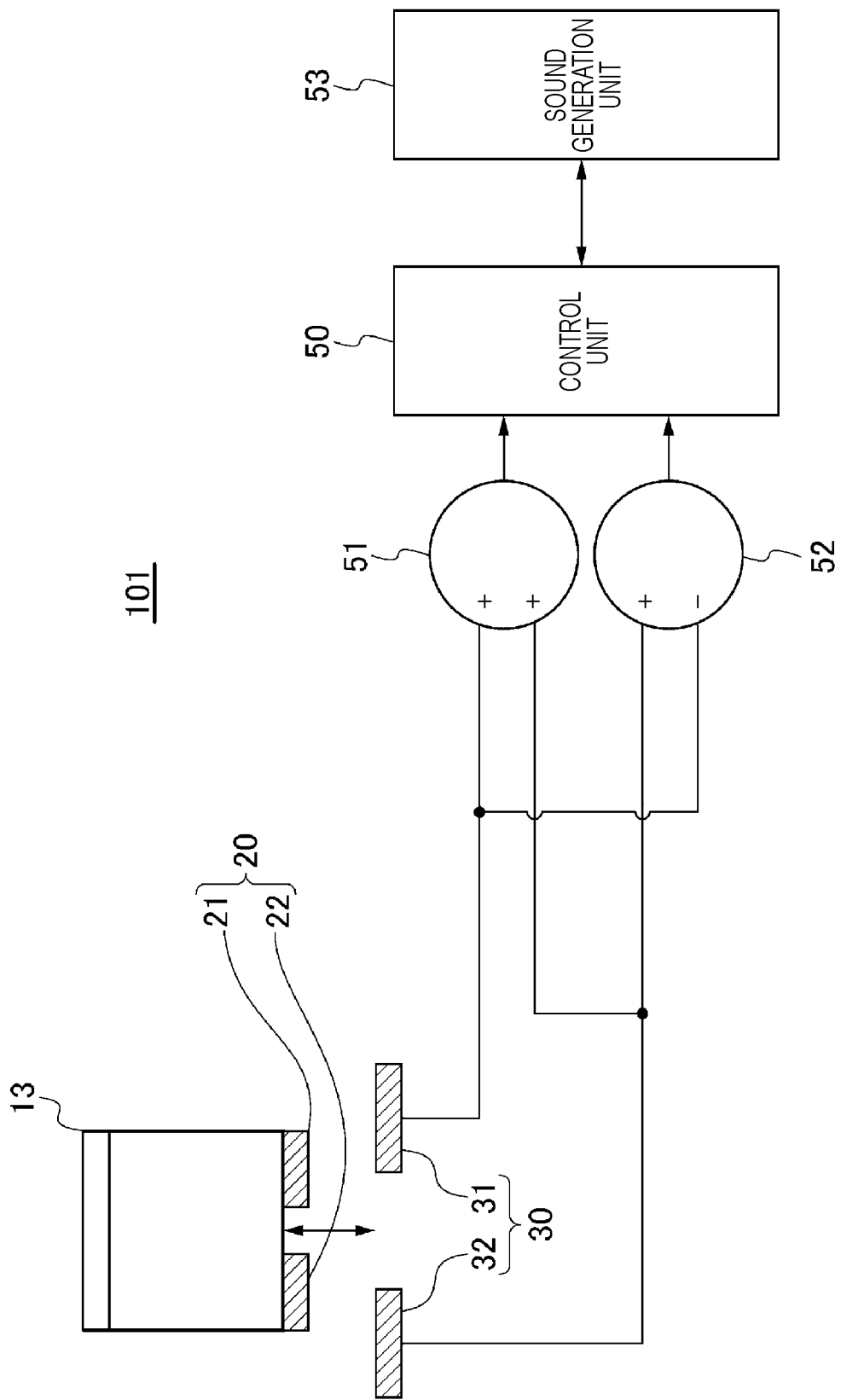
FIG. 3 is a schematic view of a main part of an operation detection device.

In a key pressing stroke of the key 13, the key-side conductive unit 20 approaches the sensor unit 30, and in a key release stroke of the key 13, the key-side conductive unit 20 is separated from the sensor unit 30. Here, even when the protrusion portion 17 reaches the lowest limit position, the key-side conductive unit 20 does not come into contact with the sensor unit 30. Therefore, the key-side conductive unit 20 is always in non-contact with the sensor unit 30. Details will be described later, and the key-side conductive unit 20 includes a pair of conductive units 21 and 22 (FIG. 3). The sensor unit 30 includes, for example, two (a pair of) signal output units 31 and 32 as a plurality of signal output units that output signals corresponding to distances from the key-side conductive units 20 of the corresponding keys 13 (FIG. 3).

Figure 2:
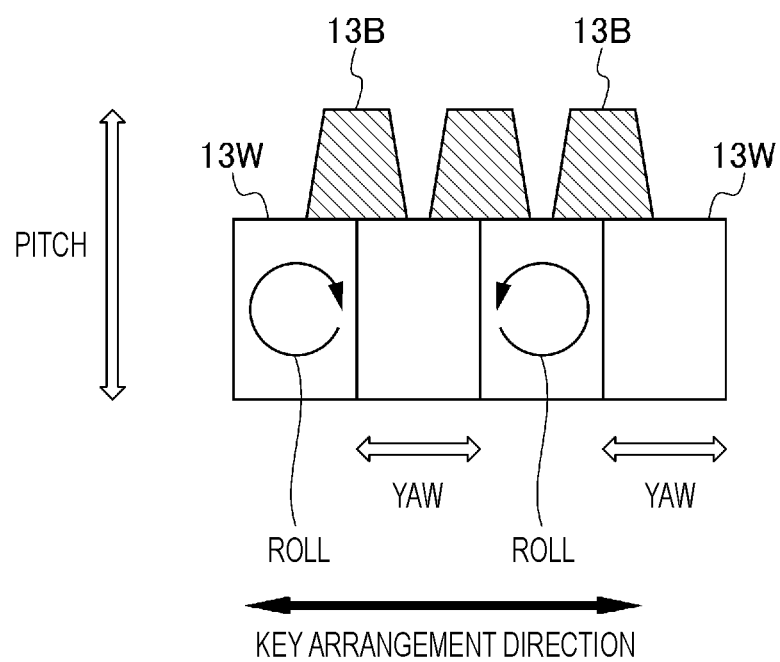
FIG. 2 is a partial front view of a keyboard unit of the keyboard device.

FIG. 2 is a partial front view of a keyboard unit of the keyboard device 100. The plurality of keys 13 include a plurality of white keys 13W and a plurality of black keys 13B. The plurality of keys 13 are disposed in the left-right direction (key arrangement direction) as viewed from the player. The configuration of each key 13 is the same as that of the key-side conductive unit 20 and the sensor unit 30 corresponding to the key 13. As shown in FIG. 2, the front end portion of the key 13 swings in a pitch direction, which is a stroke direction, by being pressed or released. The key 13 is mainly displaced in the pitch direction, but strictly speaking, is also displaced in a yaw direction and a roll direction. That is, the key 13 can be displaced also in the yaw direction by receiving a force in the left-right direction. Further, the key 13 can be displaced in a direction (roll direction) in which the key 13 rotates around an axis along the longitudinal direction by receiving a force in the left-right direction or by pressing the key 13 in the vicinity of an end position in a width direction of the key 13. Displacement in the yaw direction and the roll direction (so-called lateral swing) can be caused by a composite force.

In the related art, an after-touch by further operating a key at the key pressing end stage of the key is used for sound control to expand the expression of the sound. Typically, as the after-touch, an increase or decrease in the force in the stroke direction is detected at the key pressing end stage. In addition, after the protrusion portion 17 contacts the lower limit stopper 18 at the key pressing end stage, the player may intentionally cause lateral swing to cause an after-touch. As will be described in detail later, according to the present embodiment, by the combination of the key-side conductive unit 20 and the sensor unit 30, it is possible to detect not only the stroke position of the key 13 but also the displacement of the key 13 in the yaw direction or the roll direction in a non-contact manner. In addition, these displacements can be detected not only in the key pressing end stage but also during key pressing or key release.

The key 13 is mainly displaced in the pitch direction, but as disclosed in JP-B-4375302 and the like, the structure of the key 13 may be designed to be displaced also in the roll direction or the yaw direction.

FIG. 3 is a schematic diagram of a main part of an operation detection device 101. The operation detection device 101 includes an addition unit 51, a subtraction unit 52, and a control unit 50 in addition to the key-side conductive unit 20 and the sensor unit 30. A detection unit in the present disclosure mainly includes the addition unit 51, the subtraction unit 52, and the control unit 50. Although not shown, the control unit 50 includes a CPU, a RAM, a ROM, a timer, and the like. A sound generation unit 53 includes a sound source circuit and an effect circuit. The control unit 50 controls the sound generation of the sound generation unit 53 based on a detection result of the operation of each key 13 detected by the sensor unit 30. For example, the control unit 50 controls the generation and silencing of the sound based on the detection result in the pitch direction, and controls the effect of the generated sound based on the detection result related to the displacement in the yaw direction or the roll direction. Details of the effect imparting will be described later.

Figure 4:
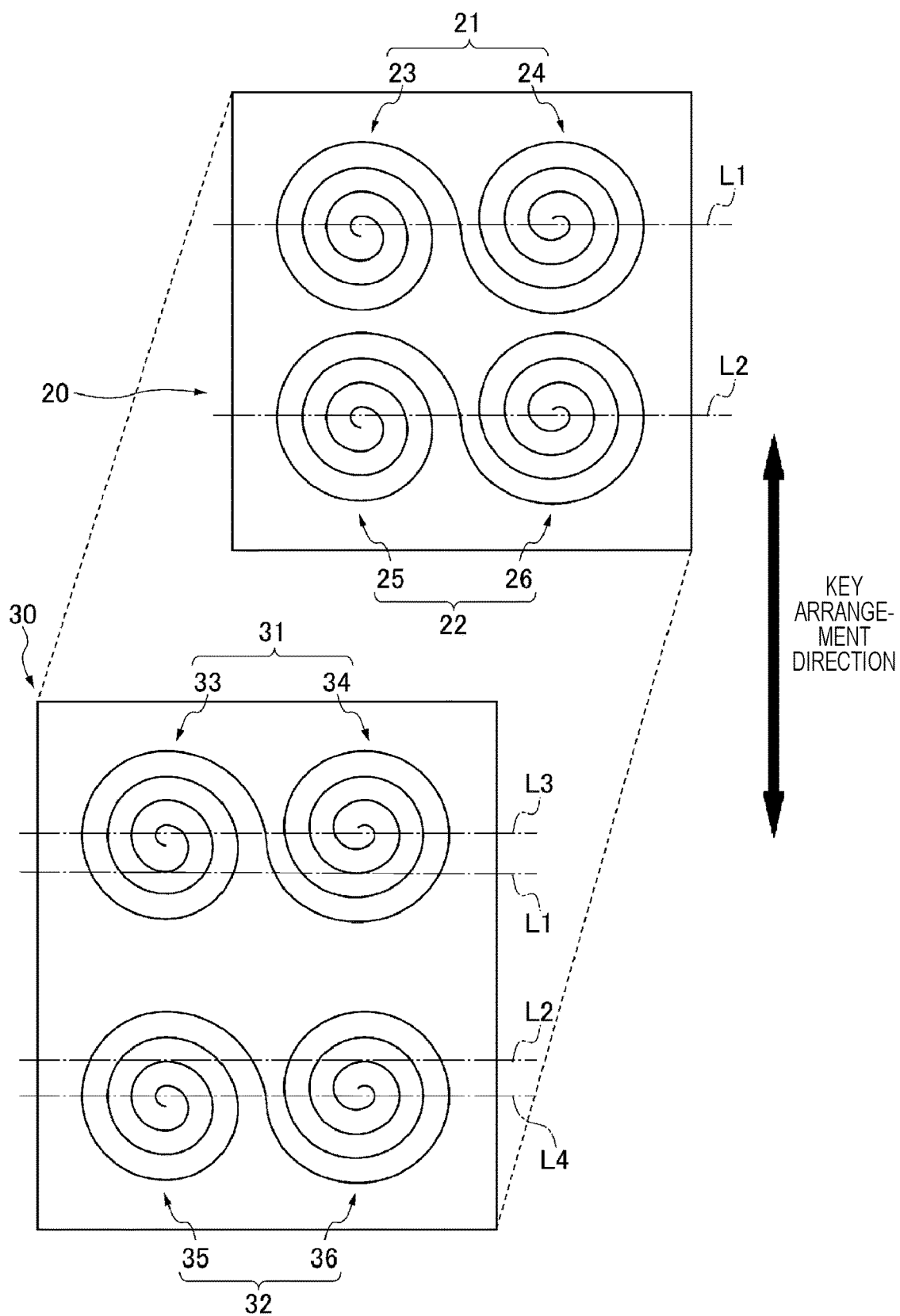
FIG. 4 is a schematic plan view showing a configuration example of a key-side conductive unit and a sensor unit.

FIG. 4 is a schematic plan view showing a configuration example of the key-side conductive unit 20 and the sensor unit 30. In FIG. 4, the key-side conductive unit 20 is shown as a projection view in a top view (plan view). The left side of FIG. 4 is the rear side of the keyboard device 100 having the fulcrum 12. In FIG. 4, illustration of a capacitor and a resistor is omitted. The key-side conductive unit 20 includes the pair of conductive units (the first conductive unit 21 and the second conductive unit 22). The first conductive unit 21 and the second conductive unit 22 are arranged in the key arrangement direction. The first conductive unit 21 is a circuit including a coil in which two spiral portions (winding portions 23 and 24) are connected to each other. The second conductive unit 22 is also a circuit including a coil in which two spiral portions (winding portions 25 and 26) are connected to each other.

The sensor unit 30 is provided corresponding to each key 13, and includes a pair of signal output units (a first signal output unit 31 and a second signal output unit 32). The first signal output unit 31 is a circuit including a coil in which two spiral portions (winding portions 33 and 34) are connected to each other. The second signal output unit 32 is also a circuit including a coil in which two spiral portions (winding portions 35 and 36) are connected to each other. The first conductive unit 21 and the second conductive unit 22 have the same configuration. The first signal output unit 31 and the second signal output unit 32 have the same configuration. The detailed configurations of the first conductive unit 21 and the first signal output unit 31 will be described as a representative with reference to FIGS. 5 to 8.

Figure 5:
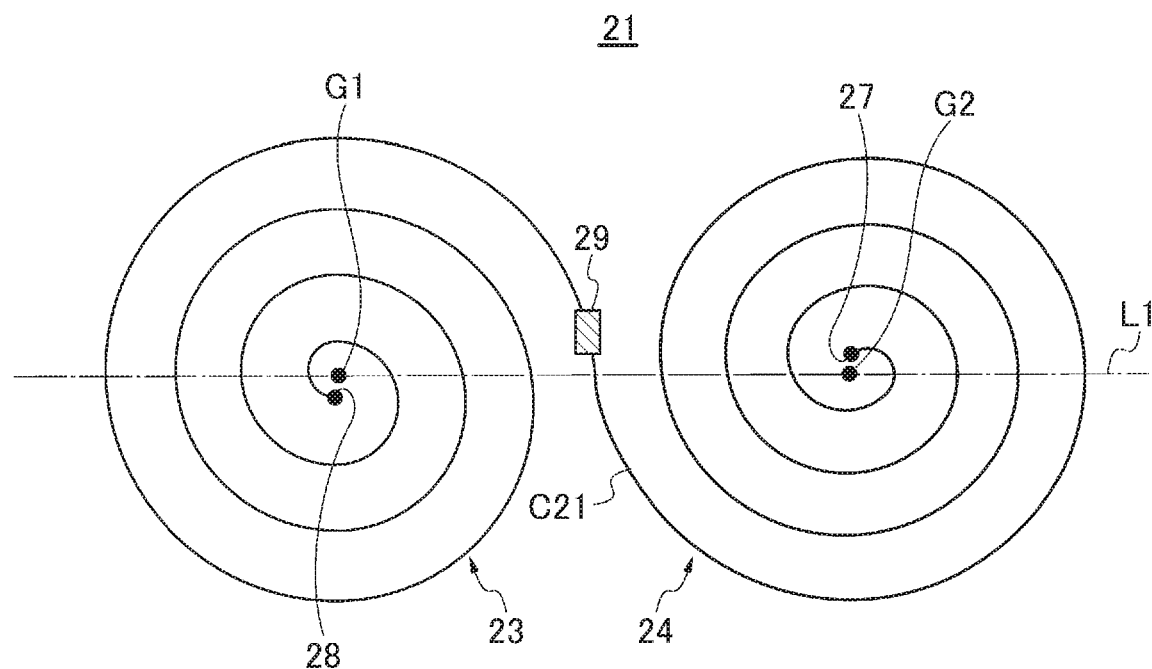
FIG. 5 is an enlarged view of a first conductive unit in a top view.

FIG. 5 is an enlarged view of the first conductive unit 21 in a top view. The first conductive unit 21 includes an 8-shaped coil C21 as a whole. The coil C21 is disposed in a planar shape at a front end of the protrusion portion 16 of the key 13. The coil C21 is continuous from a via hole 27 to a via hole 28 through a capacitor 29. Further, the via hole 27 and the via hole 28 are directly connected to each other on a back surface of the substrate. The winding portion 23 and the winding portion 24 are adjacent to each other. The positions of the centers of gravity of the winding portions 23 and 24 are referred to as centers of gravity G1 and G2, respectively. The centers of gravity G1 and G2 are defined as the positions of the centers of gravity of the figures having substantially circular outer shapes of the winding portions 23 and 24. Alternatively, the centers of gravity G1 and G2 may be defined as the positions of the centers of gravity of the winding portions 23 and 24, respectively, focusing on the mass of the winding portions 23 and 24. A straight line L1 passing through the centers of gravity G1 and G2 is substantially parallel to the longitudinal direction of the key 13. A straight line L2 (FIG. 4) passing through the centers of gravity G1 and G2 of the winding portions 25 and 26 of the second conductive unit 22 is also substantially parallel to the longitudinal direction of the key 13. Therefore, the first conductive unit 21 and the second conductive unit 22 are disposed such that the straight lines L1 and L2 are substantially parallel to each other.

Figure 6:
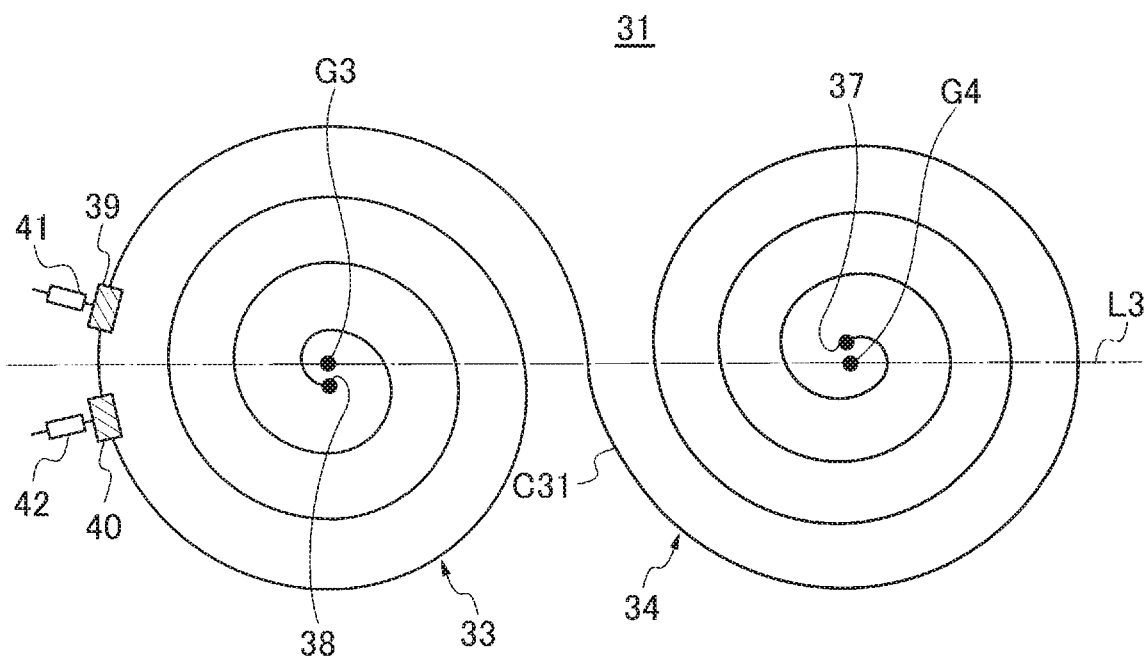
FIG. 6 is an enlarged view of a first signal output unit in a top view.

FIG. 6 is an enlarged view of the first signal output unit 31 in a top view. The first signal output unit 31 includes an 8-shaped coil C31 as a whole. The coil C31 is disposed on the circuit substrate 15 in a planar shape. The coil C31 is continuous from a via hole 37 to a via hole 38 via capacitors 39 and 40. Further, the via hole 37 and the via hole 38 are directly connected to each other on the back surface of the substrate. A resistor 41 is connected to the capacitor 39, and a resistor 42 is connected to the capacitor 40. It is not essential to provide the resistors 41 and 42. The winding portion 33 and the winding portion 34 are adjacent to each other. The positions of the centers of gravity of the winding portions 33 and 34 are referred to as centers of gravity G3 and G4, respectively. The definitions of the centers of gravity G3 and G4 are the same as those of the centers of gravity G1 and G2. A straight line L3 passing through the centers of gravity G3 and G4 is substantially parallel to the longitudinal direction of the key 13. A straight line L4 (FIG. 4) passing through the centers of gravity G1 and G2 of the winding portions 35 and 36 of the second signal output unit 32 is also substantially parallel to the longitudinal direction of the key 13. Therefore, the first signal output unit 31 and the second signal output unit 32 are disposed such that the straight lines L3 and L4 are substantially parallel to each other. In addition, as shown in FIG. 4, an interval between the straight lines L3 and L4 is wider than an interval between the straight lines L1 and L2.

As shown in FIG. 5, the winding portions 23 and 24 have the same spiral direction as each other with a center of each of the winding portions 23 and 24 as a base point. That is, when the via hole 28 close to the center of gravity G1 is regarded as a starting point, the spiral direction of the winding portion 23 is the clockwise direction. When the via hole 27 close to the center of gravity G2 is regarded as a starting point, the spiral direction of the winding portion 24 is also the clockwise direction. From such a relationship, when a current flows through the coil C21 in a certain direction, a direction of a magnetic flux in the winding portion 23 and a direction of a magnetic flux in the winding portion 24 are opposite to each other. Similarly, as shown in FIG. 6, the winding portions 33 and 34 have the same spiral direction as each other with a center of each of the winding portions 33 and 34 as a base point. When a current flows through the coil C31 in a certain direction, a direction of a magnetic flux in the winding portion 33 and a direction of a magnetic flux in the winding portion 34 are opposite to each other.

Figure 7:
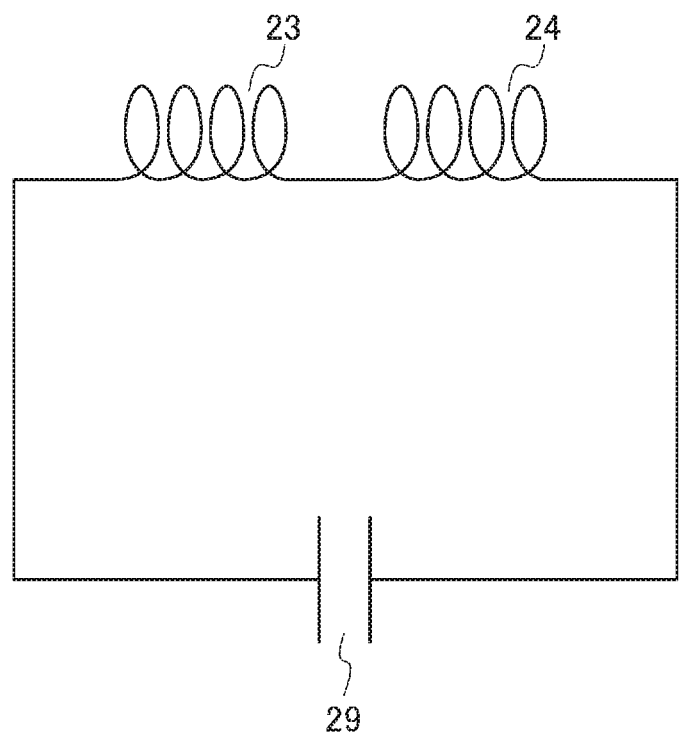
FIG. 7 is a circuit diagram of the first conductive unit.
Figure 8:
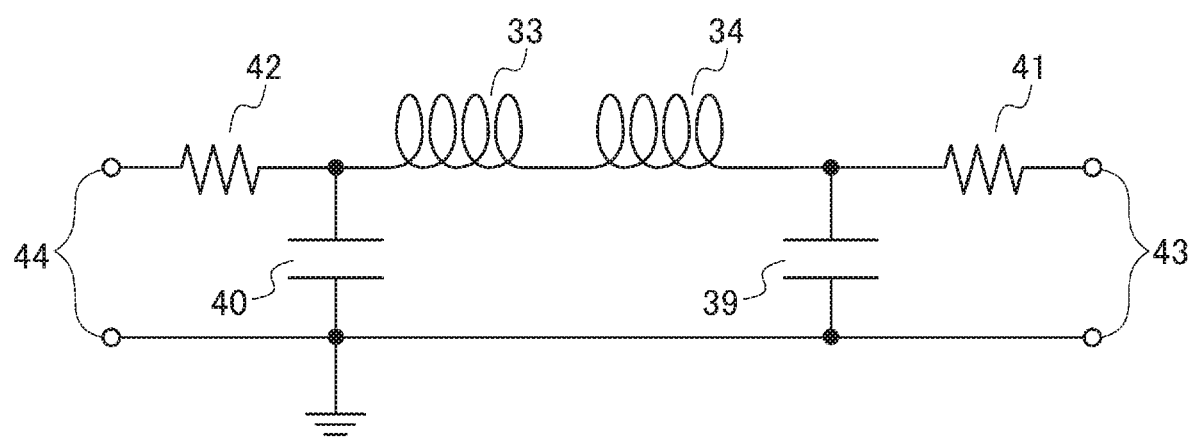
FIG. 8 is a circuit diagram of the first signal output unit.

FIG. 7 is a circuit diagram of the first conductive unit 21. FIG. 8 is a circuit diagram of the first signal output unit 31. The first conductive unit 21 is configured as a resonance circuit on the passive side. The first conductive unit 21 is a closed circuit. The first signal output unit 31 is configured as a resonant circuit on the active side. These resonant circuits have basically the same configuration as that disclosed in WO 2019/122867A1.

In the first signal output unit 31, an input-side terminal 44 is connected to a drive circuit (not shown). A detection signal is obtained from an output-side terminal 43. As shown in FIG. 3, a detection signal from the second signal output unit 32 is input to the positive terminal of the addition unit 51 and the positive terminal of the subtraction unit 52. A detection signal from the first signal output unit 31 is input to the other positive terminal of the addition unit 51 and the negative terminal of the subtraction unit 52. In order to correct the phase shift between the detection signal from the first signal output unit 31 and the detection signal from the second signal output unit 32, the respective outputs may be input to the addition unit 51 and the subtraction unit 52 via a smoothing circuit (not shown). The addition unit 51 outputs a sum of the detection signals from the first signal output unit 31 and the second signal output unit 32 to the control unit 50. The subtraction unit 52 outputs a difference between the detection signal from the first signal output unit 31 and the detection signal from the second signal output unit 32 to the control unit 50. These detection signals are continuous amounts.

The outputs of the signal output units 31 and 32 are, for example, voltage values. When the first conductive unit 21 approaches the first signal output unit 31 in a state where the signal output units 31 and 32 are driven at a predetermined resonance frequency, a current flows in the first conductive unit 21 in a direction in which the magnetic flux generated in the first signal output unit 31 is cancelled. As a result, the magnetic flux of the first signal output unit 31 changes, and the voltage changes. Therefore, the detection signal can be obtained as a voltage value. The output of the first signal output unit 31 decreases as the first conductive unit 21 approaches the first signal output unit 31. Similarly, when the second conductive unit 22 approaches the second signal output unit 32, the output of the second signal output unit 32 decreases accordingly. That is, the outputs (voltages) of the signal output units 31 and 32 change according to distances to the corresponding conductive units 21 and 22, and the outputs become smaller as the distances become shorter. A change in a resonance signal or a current value may be adopted as the outputs of the signal output units 31 and 32.

In particular, as described above, both the coil C21 and the coil C31 have an 8-shape. Therefore, a relationship between the first signal output unit 31 and the first conductive unit 21 is as follows. First, when the first conductive unit 21 approaches the first signal output unit 31 in a state where an upward magnetic flux is generated from the winding portion 33 of the first signal output unit 31 and a downward magnetic flux is generated from the winding portion 34, a current in a direction in which the upward magnetic flux from the winding portion 33 is cancelled flows in the winding portion 23 of the first conductive unit 21. As a result, an upward magnetic flux is generated in the winding portion 24 of the first conductive unit 21, and therefore, the downward magnetic flux of the winding portion 34 of the first signal output unit 31 is weakened. Therefore, the change in the output of the first signal output unit 31 is larger than that in a configuration in which the winding direction of the winding portion 33 and the winding direction of the winding portion 34 are opposite to each other. As a result, the sensitivity as a sensor is increased.

From the viewpoint of preventing crosstalk, the first signal output unit 31 and the second signal output unit 32 may have different resonance frequencies. In addition, as disclosed in WO 2019/122867A1, the plurality of sensor units 30 may have different resonance frequencies. In particular, the sensor units 30 corresponding to the adjacent keys 13 may have different resonance frequencies. In addition, as disclosed in WO 2019/122867A1 and JP-B-4375302, when each sensor unit 30 is driven, time division processing may be executed using a multiplexer and a demultiplexer. For example, the plurality of sensor units 30 are grouped in a key region such that physically adjacent sensor units 30 are not simultaneously driven. For example, the sensor units 30 may be simultaneously driven one by one in each group in order from the low frequency sensor unit 30 in each group.

Figure 9:
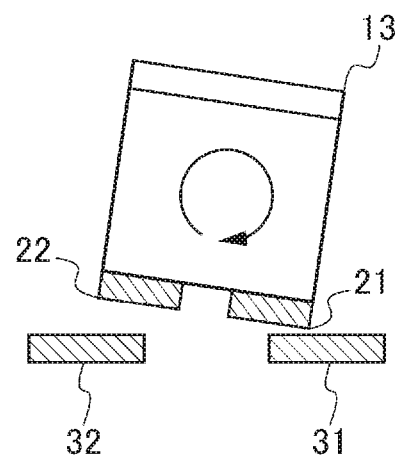
FIG. 9 is a schematic front view of one key and a sensor unit corresponding to the key.
Figure 10:
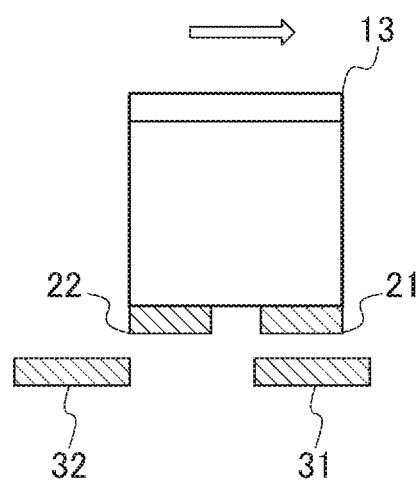
FIG. 10 is a schematic front view of one key and a sensor unit corresponding to the key.

FIGS. 9 and 10 are schematic front views of one key 13 and the sensor unit 30 corresponding to the key 13. The stroke position and the lateral swing (displacement in the yaw direction or the roll direction) of the key 13 are detected as follows.

First, when the key-side conductive unit 20 approaches the sensor unit 30 by a key pressing operation, as shown in FIG. 3, the detection signals of the signal output units 31 and 32 are input to the addition unit 51 and the subtraction unit 52. The control unit 50 detects the stroke position of the key 13 based on the sum of the detection signals of the signal output units 31 and 32 received from the addition unit 51. At this time, for example, as the sum of the detection signals of the signal output units 31 and 32 is smaller, the stroke position is detected as a deeper position.

In parallel with this, the control unit 50 detects the magnitude of the lateral swing of the key 13 based on the difference between the detection signals of the signal output units 31 and 32 received from the subtraction unit 52. At this time, as the difference between the detection signals of the signal output units 31 and 32 is larger, the lateral swing is detected as a larger value. As shown in FIG. 9, when a right portion of a key pressing surface of the key 13 is pressed, the key 13 rolls rightward. In this case, the distance between the first conductive unit 21 and the first signal output unit 31 is shorter than the distance between the second conductive unit 22 and the second signal output unit 32. Therefore, since the first signal output unit 31 outputs the detection signal smaller than that of the second signal output unit 32, the difference between the detection signals becomes large. As a result, the control unit 50 can detect the roll direction and the magnitude of the roll displacement of the key 13.

As described above, as shown in FIG. 4, the interval between the straight lines L3 and L4 is wider than the interval between the straight lines L1 and L2. That is, the first signal output unit 31 is disposed to be shifted to the right side in the key arrangement direction with respect to the first conductive unit 21, and the second signal output unit 32 is disposed to be shifted to the left side (the direction opposite to the first signal output unit 31) in the key arrangement direction with respect to the second conductive unit 22. As shown in FIG. 10, when the key 13 receives a rightward force, the key 13 is displaced rightward in the horizontal direction. In this case, an overlapping area between the first conductive unit 21 and the first signal output unit 31 is larger than an overlapping area between the second conductive unit 22 and the second signal output unit 32 in terms of projection in a plan view. Therefore, the magnetic flux caused by the first conductive unit 21 acting on the first signal output unit 31 is stronger than the magnetic flux caused by the second conductive unit 22 acting on the second signal output unit 32. Then, since the first signal output unit 31 outputs the detection signal smaller than that of the second signal output unit 32, the difference between the detection signals becomes large. As a result, the control unit 50 can detect the magnitude of the displacement of the key 13 in the yaw direction.

Due to such a shift arrangement, the difference between the detection signals of the signal output units 31 and 32 when the key 13 is displaced in the horizontal direction becomes large, such that the sensitivity of detection in the yaw direction becomes high. The roll displacement and the yaw displacement are generated in a composite manner, and it is difficult for the player to perform the performance while being conscious of both of the roll displacement and the yaw displacement, and therefore, there is no significant significance in distinguishing between the roll displacement and the yaw displacement in the detection of the displacement. Therefore, the control unit 50 captures the roll displacement and the yaw displacement in a complex manner and detects the roll displacement and the yaw displacement as lateral swing, and uses the lateral swing for the effect control.

A shift direction of the first signal output unit 31 with respect to the first conductive unit 21 and a shift direction of the second signal output unit 32 with respect to the second conductive unit 22 may be opposite to the structure shown in FIG. 4. In addition, the shift arrangement is not essential, the interval between the straight lines L1 and L2 and the interval between the straight lines L3 and L4 are the same, and the first conductive unit 21, the second conductive unit 22, the first signal output unit 31, and the second signal output unit 32 may be disposed such that the straight lines L1 and L2 and the straight lines L3 and L4 overlap each other. In this case, from the viewpoint of preventing crosstalk, it is desirable to dispose the key-side conductive unit 20 and the sensor unit 30, such that the center of gravity G1 and the center of gravity G3 coincide with each other, and the center of gravity G2 and the center of gravity G4 coincide with each other.

The control unit 50 detects the stroke position of the key 13 at any time during key pressing or key release. When the stroke position of the key 13 becomes deeper than a first predetermined position, the controller 50 generates a note-on event, and causes the sound generation unit 53 to start sound emitting. After the start of sound emitting, the control unit 50 performs after-touch control for imparting an effect such as vibrato based on the magnitude of the detected lateral swing. For example, the control unit 50 increases the degree of the imparted effect or shortens the cycle as the lateral swing of the key 13 increases. The detection result may be used for the control of the effect imparting not only in the key pressing end stage but also during the key pressing or key release.

In addition, when the stroke position of the key 13 in the key release stroke is shallower than a second predetermined position (shallower than the first predetermined position) during sound generation, the control unit 50 causes the sound generation unit 53 to start silencing. The control unit 50 may detect a key pressing speed based on a time required for the key 13 to reach the first predetermined position from a third predetermined position (shallower than the first predetermined position), and use the detected key pressing speed for sound control such as the sound volume. Similarly, a key release speed may be detected during the key release operation and used for sound control. The effect parameter to be controlled is not limited.

The arrangement shown in FIG. 4 may be applied to both the white key 13W and the black key 13B, but it is difficult to realize if the key width is narrow. The arrangement shown in FIG. 4 is suitable for the white key 13W. The arrangement suitable for the black key 13B having a narrow key width will be described with reference to FIG. 11.

Figure 11:
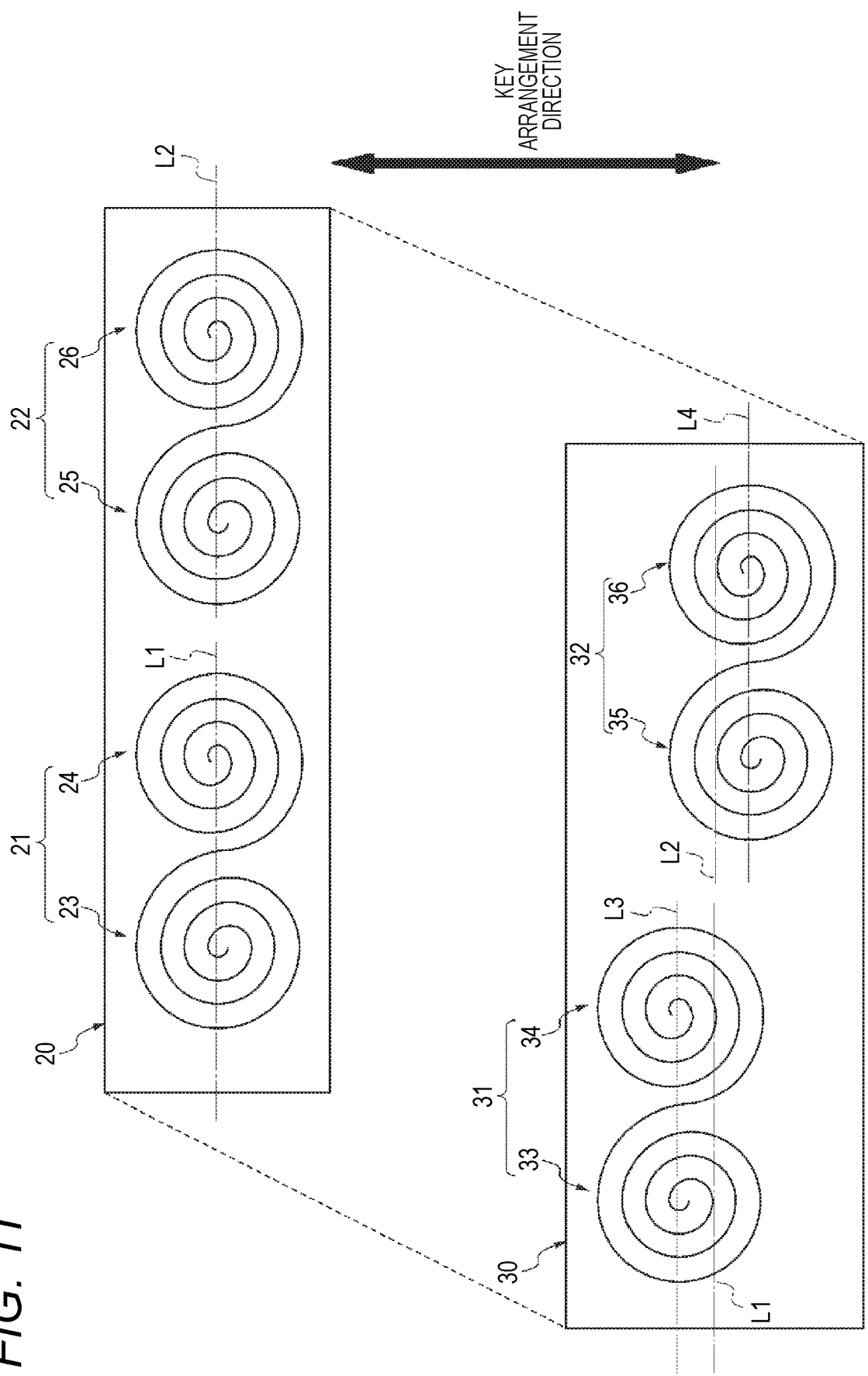
FIG. 11 is a schematic plan view showing a configuration example of the key-side conductive unit and the sensor unit.

FIG. 11 is a schematic plan view showing the configuration example of the key-side conductive unit 20 and the sensor unit 30. In FIG. 11, the key-side conductive unit 20 is shown as a projection view in a top view. In FIG. 11, illustration of a capacitor and a resistor is omitted. The configuration of each of the first conductive unit 21, the second conductive unit 22, the first signal output unit 31, and the second signal output unit 32 is the same as the configuration described in FIG. 4.

As shown in FIG. 11, the straight lines L1 and L2 are located on the same straight line, and the conductive units 21 and 22 are arranged in the key longitudinal direction on the same straight line. The left side in the key longitudinal direction in FIG. 11 is the rear side of the keyboard device 100 having the fulcrum 12. On the other hand, the signal output units 31 and 32 are also arranged in the key longitudinal direction, but are not located on the same straight line. That is, the straight line L3 is located on the right side of the straight line L1, and the first signal output unit 31 is disposed to be shifted to the right side in the key arrangement direction with respect to the first conductive unit 21. The straight line L4 is located on the left side of the straight line L2, and the second signal output unit 32 is disposed to be shifted to the left side (the direction opposite to the first signal output unit 31) in the key arrangement direction with respect to the second conductive unit 22. With such a shift arrangement, the same effect as that of the arrangement shown in FIG. 4 can be achieved with respect to the enhancement of the detection sensitivity in the yaw direction. The arrangement shown in FIG. 11 may also be adopted in the white key 13W. The straight line L1 and the straight line L2 are added to the signal output units 31 and 32 of FIG. 11 for comparison.

According to the present embodiment, each of the plurality of keys 13 includes the key-side conductive unit 20 as a pair of conductive units. The sensor unit 30 (the pair of signal output units 31 and 32) corresponding to each key 13 is provided on the circuit substrate 15. The sensor unit 30 outputs a signal corresponding to the distance from the key-side conductive unit 20 of the corresponding key 13. In the key pressing stroke, the control unit 50 detects the displacement of the corresponding key 13 in at least one of the yaw direction and the roll direction based on the signal output from the sensor unit 30. Therefore, a displacement of the key in the yaw direction or the roll direction can be detected even during key pressing.

In particular, since the lateral swing of the key 13 can be detected even during the key pressing stroke or the key release stroke, the detection result can be used for sound control not only in the after-touch control but also during the key operation, and can be applied to various sound representations.

In addition, the control unit 50 detects the stroke position of the corresponding key 13 based on the signals output from the signal output units 31 and 32. For example, the control unit 50 detects the stroke based on the sum of the signals respectively output from the signal output units 31 and 32, and detects the displacement in the yaw direction or the roll direction based on the difference between the signals respectively output from the signal output units 31 and 32. Therefore, it is possible to detect not only the yaw direction or the roll direction of the key but also the stroke position of the key by using the same sensor unit 30.

In particular, since the pair of signal output units 31 and 32 are arranged in the key arrangement direction, it is possible to detect the displacement of the key 13 in the roll direction. In addition, the displacement in the yaw direction can be accurately detected by the shift arrangement shown in FIGS. 4 and 11.

In addition, in each of the key-side conductive unit 20 and the sensor unit 30, the two spiral portions adjacent to each other in the key longitudinal direction have the same spiral direction as each other with a center of each of the two spiral portions as a base point, such that crosstalk can be prevented.

In the present embodiment, since the detection of the stroke position and the detection of the lateral shake of the key 13 can be realized by the common sensor unit, the configuration can be simplified. It is not necessary to separately provide an optical sensor for detecting the stroke position of the key 13 and for detecting the lateral shake of the key 13. However, in order to detect the stroke position and the key pressing speed, an optical or contact-type position sensor or speed sensor may be separately provided. It is not essential to detect the stroke position from the detection signals of the pair of signal output units 31 and 32.

Figure 12:
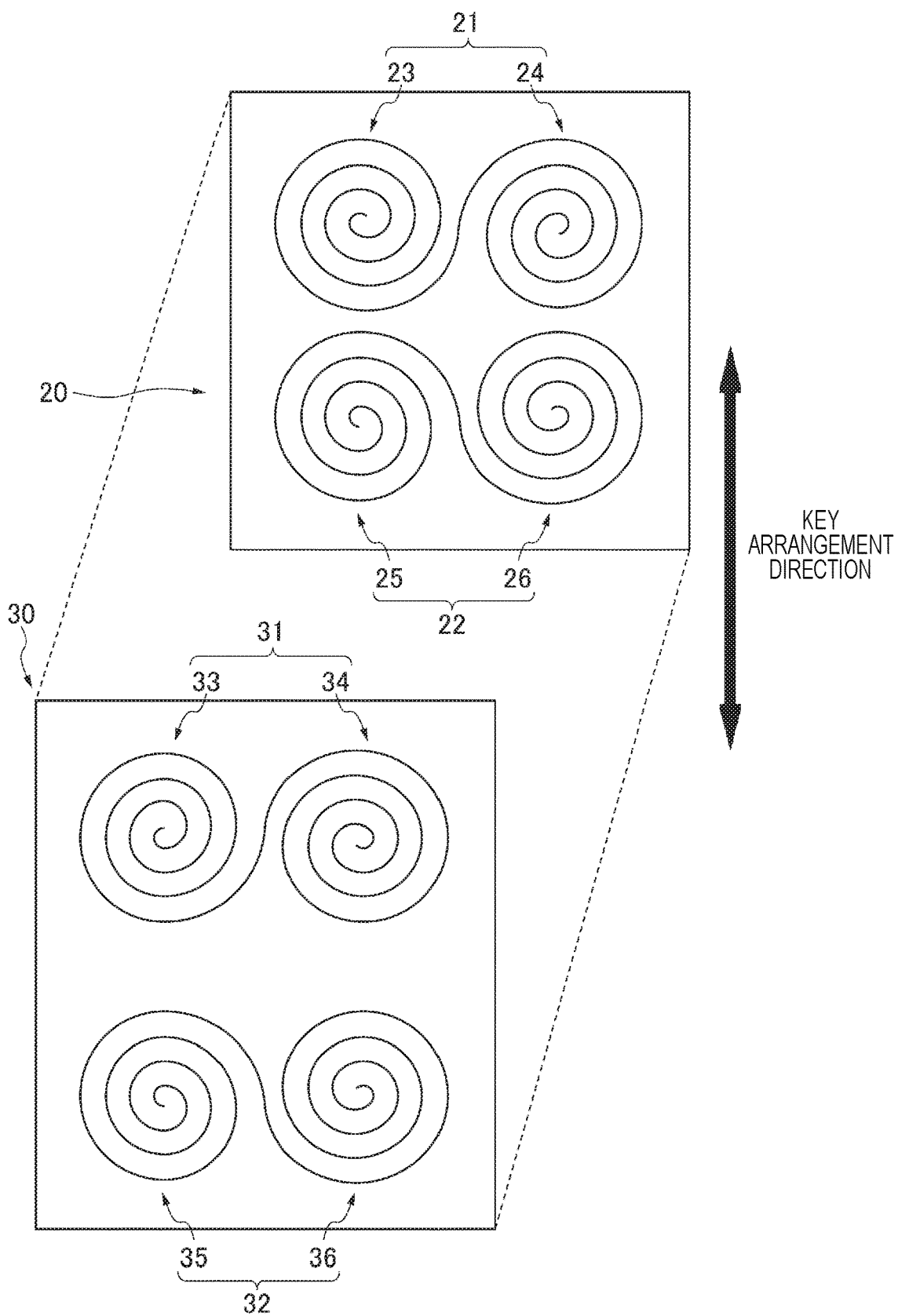
FIG. 12 is a schematic plan view showing a configuration example of a first modification of the key-side conductive unit and the sensor unit.

Hereinafter, various modifications will be described with reference to FIGS. 12 to 16. FIG. 12 is a schematic plan view showing a configuration example of a first modification of the key-side conductive unit 20 and the sensor unit 30. In the example of FIG. 12, the winding directions of the winding portions 23 and 24 of the first conductive unit 21 are opposite to those in the example of FIG. 4. Therefore, the winding portions adjacent to each other in the key arrangement direction, that is, the winding portion 23 of the first conductive unit 21 and the winding portion 25 of the second conductive unit 22 have opposite spiral directions with the centers as base points. Similarly, the winding portions 24 and 26 adjacent to each other in the key arrangement direction have opposite spiral directions with the centers as base points.

In addition, similarly, in the example of FIG. 12, the winding directions of the winding portions 33 and 34 of the first signal output unit 31, which are winding portions adjacent to each other in a direction orthogonal to the key arrangement direction, are opposite to those in the example of FIG. 4. Therefore, the winding portions 33 and 35 adjacent to each other in the key arrangement direction have opposite spiral directions with the centers as base points. Similarly, the winding portions 34 and 36 adjacent to each other in the direction orthogonal to the key arrangement direction have opposite spiral directions with the centers as base points. As described above, in each of the key-side conductive unit 20 and the sensor unit 30, the winding portions adjacent to each other in the key arrangement direction have opposite spiral directions with the centers as base points. With this configuration, the directions of the generated magnetic fluxes are opposite not only between the winding portions adjacent to each other in the key longitudinal direction but also between the winding portions adjacent to each other in the key arrangement direction, thereby further contributing to the prevention of crosstalk.

Figure 13:
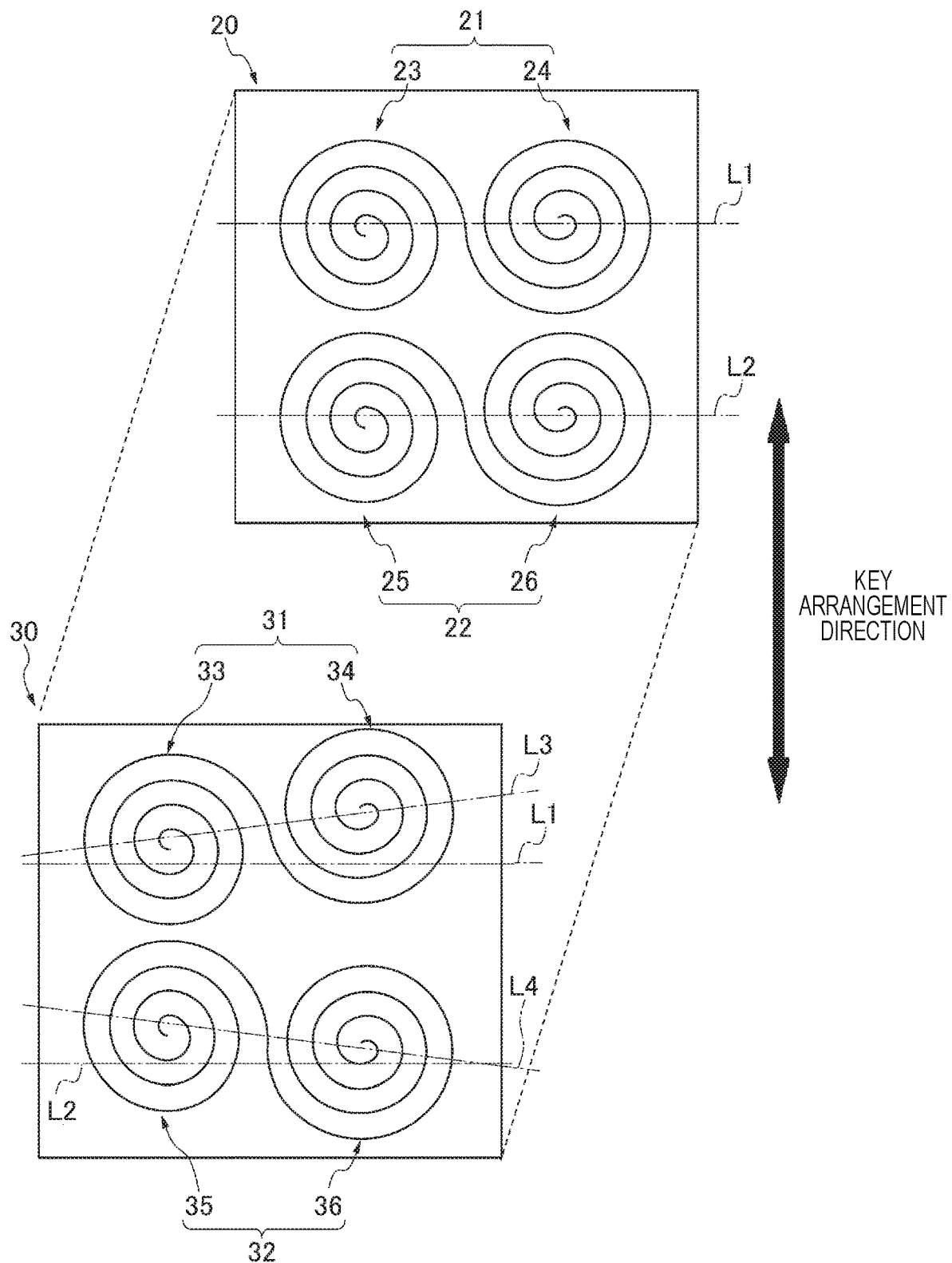
FIG. 13 is a schematic plan view showing a configuration example of a second modification of the key-side conductive unit and the sensor unit.

FIG. 13 is a schematic plan view showing a configuration example of a second modification of the key-side conductive unit 20 and the sensor unit 30. In the example of FIG. 4, the conductive units 21 and 22 and the signal output units 31 and 32 are all substantially parallel to the key longitudinal direction. On the other hand, in the example of FIG. 13, the signal output units 31 and 32 are disposed to be inclined with respect to the key longitudinal direction. The configuration of the key-side conductive unit 20 is the same as that of the example of FIG. 4.

As shown in FIG. 13, the winding portion 23 and the winding portion 33 overlap each other, and the winding portion 25 and the winding portion 35 overlap each other. On the other hand, the winding portions 34 and 36 are located outward of the winding portions 24 and 26 in the key width direction. Therefore, the interval between the straight line L3 passing through the centers of gravity G3 and G4 of the winding portions 33 and 34 of the first signal output unit 31 and the straight line L4 passing through the centers of gravity G3 and G4 of the winding portions 35 and 36 of the second signal output unit 32 increases toward the front end side of the key 13. Therefore, in a plan view, the straight line L3 is located rightward with respect to the straight line L1 as the straight line L3 goes forward, and the interval between the straight line L3 and the straight line L1 increases toward the front end side of the key 13. In the plan view, the straight line L4 is located leftward with respect to the straight line L2 as the straight line L4 goes forward, and the interval between the straight line L4 and the straight line L2 increases toward the front end side of the key 13. The straight line L1 and the straight line L2 are added to the signal output units 31 and 32 of FIG. 13 for comparison.

By disposing the pair of signal output units 31 and 32 in such a tapered shape, it is possible to detect the yaw displacement and the roll displacement without adopting the shift arrangement. That is, when the key 13 is displaced in the roll direction (FIG. 9), a difference in the distance between the opposing winding portions occurs, and thus an output difference between the signal output units 31 and 32 increases. As a result, the roll displacement can be detected in the same manner as in the example of FIG. 4. On the other hand, when the key 13 is displaced in the yaw direction (FIG. 10), a rotational displacement (though not large) of the front end portion of the key around the fulcrum 12 is involved. For example, when the conductive units 21 and 22 are rotationally displaced to the right, an angle formed by the straight line L1 and the straight line L3 becomes small, while an angle formed by the straight line L2 and the straight line L4 becomes large in the plan view. When the conductive units 21 and 22 are rotationally displaced to the left side, an action opposite to the above occurs. As a result, the output difference between the signal output units 31 and 32 increases, and the yaw displacement can be detected in the same manner as in the example of FIG. 4.

Figure 14:
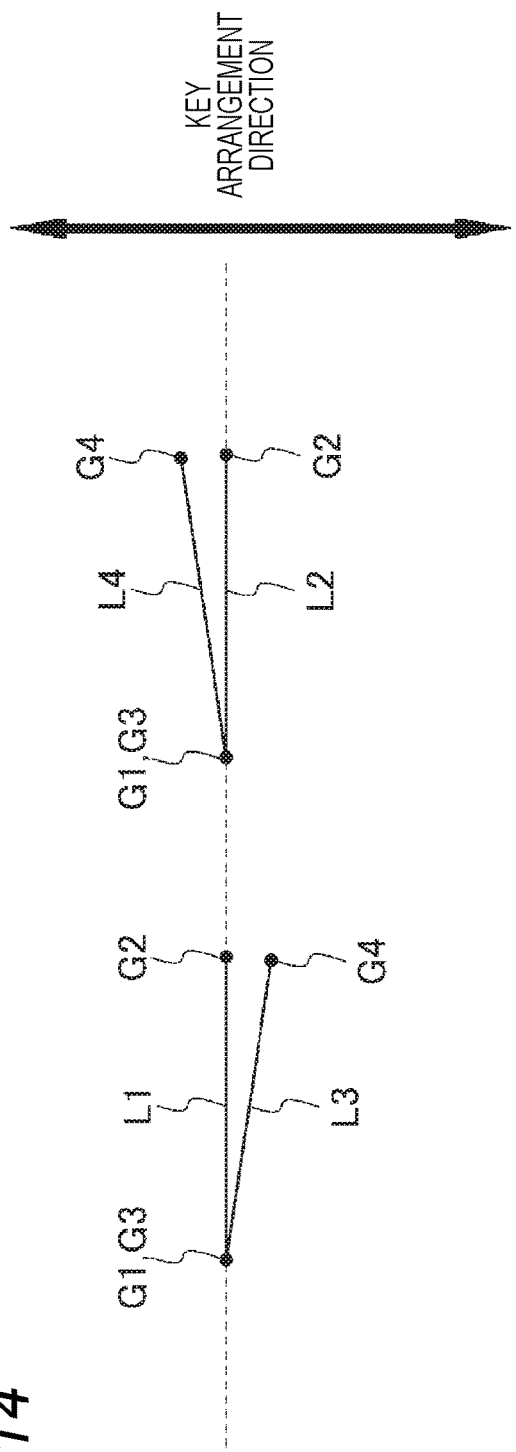
FIG. 14 is a schematic plan view showing a configuration example of a third modification of the key-side conductive unit and the sensor unit.

FIG. 14 is a schematic view showing a third modification of the key-side conductive unit 20 and the sensor unit 30 in which the conductive units 21 and 22 and the signal output units 31 and 32 are disposed in the key longitudinal direction, respectively. The arrangement of the tapered shape described with reference to FIG. 13 is also applicable to a narrow key such as the black key 13B. In FIG. 14, since attention is paid to the inclination in a plan view, the arrangement of each of the winding portions is shown by the position of the center of gravity. The significance of the straight lines L1 to L4 is the same as in FIG. 11.

The straight lines L1 and L2 are located on the same straight line, and the conductive units 21 and 22 are disposed on the same straight line in the key longitudinal direction. In the plan view, the straight line L3 is located leftward with respect to the straight line L1 as the straight line L3 goes forward, and the interval between the straight line L3 and the straight line L1 increases toward the front end side of the key 13. In the plan view, the straight line L4 is located rightward with respect to the straight line L2 as the straight line L4 goes forward, and the interval between the straight line L4 and the straight line L2 increases toward the front end side of the key 13. With such a tapered arrangement, the yaw displacement and the roll displacement of the black key 13B can be detected in the same manner as in the example of FIG. 13.

Figure 15:
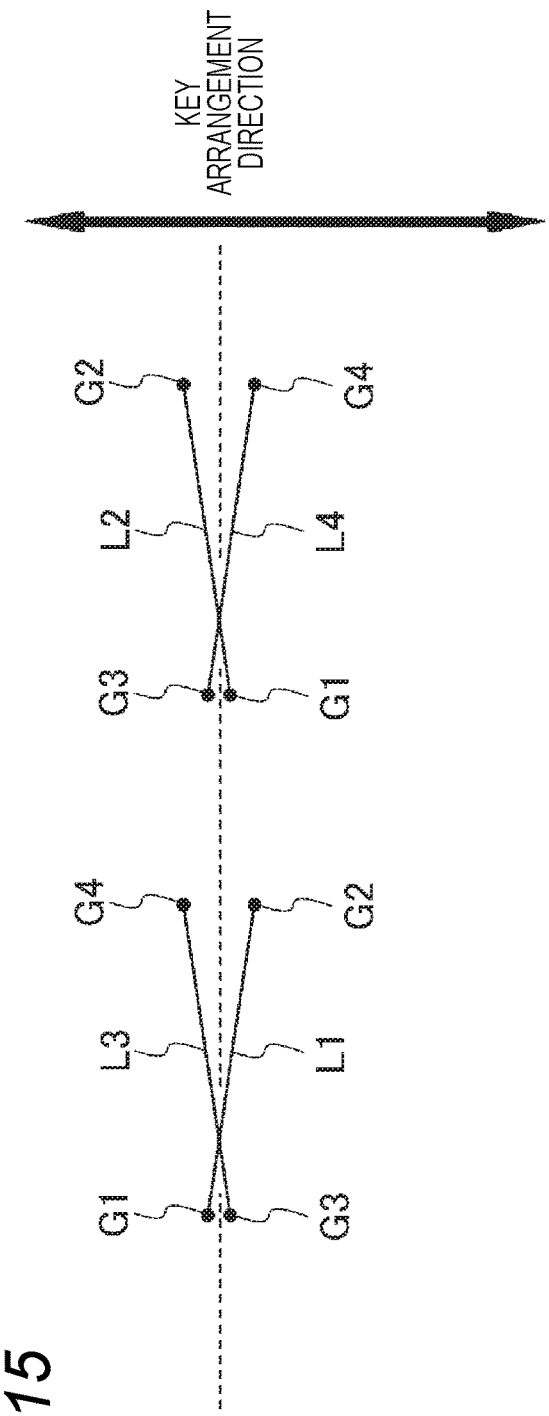
FIG. 15 is a schematic plan view showing a configuration example of a fourth modification of the key-side conductive unit and the sensor unit.

FIG. 15 is a schematic view showing a fourth modification of the key-side conductive unit 20 and the sensor unit 30 in which the conductive units 21 and 22 and the signal output units 31 and 32 are disposed in the key longitudinal direction. In FIG. 15, as in FIG. 14, the arrangement of each of the winding portions is shown by the position of the center of gravity of each of the winding portions. The center of gravity G1 and the center of gravity G3 do not need to coincide with each other. That is, as shown in FIG. 15, all of the straight lines L1 to L4 may be inclined with respect to the key longitudinal direction in a plan view. The straight line L1 and the straight line L3 cross each other in a range between the center of gravity G1 and the center of gravity G2. The straight line L2 and the straight line L4 cross each other in a range between the center of gravity G1 and the center of gravity G2. Even in such a tapered arrangement, the yaw displacement and the roll displacement can be detected. The cross-tapered arrangement shown in FIG. 15 is also applicable to the white key 13W.

As shown in FIGS. 13, 14, and 15, in order to make it possible to detect the roll displacement and the yaw displacement by the tapered arrangement of the winding portions, the following conditions may be satisfied. In the plan view, a relative inclination direction of the first signal output unit 31 with respect to the first conductive unit 21 and a relative inclination direction of the second signal output unit 32 with respect to the second conductive unit 22 may be opposite to each other. In this case, the side on which the interval increases due to the tapered shape does not have to be the front side in the key longitudinal direction, and may be the rear side.

Both the shift arrangement shown in FIGS. 4 and 11 and the tapered arrangement shown in FIGS. 13 to 15 may be applied in combination.

Figure 16:
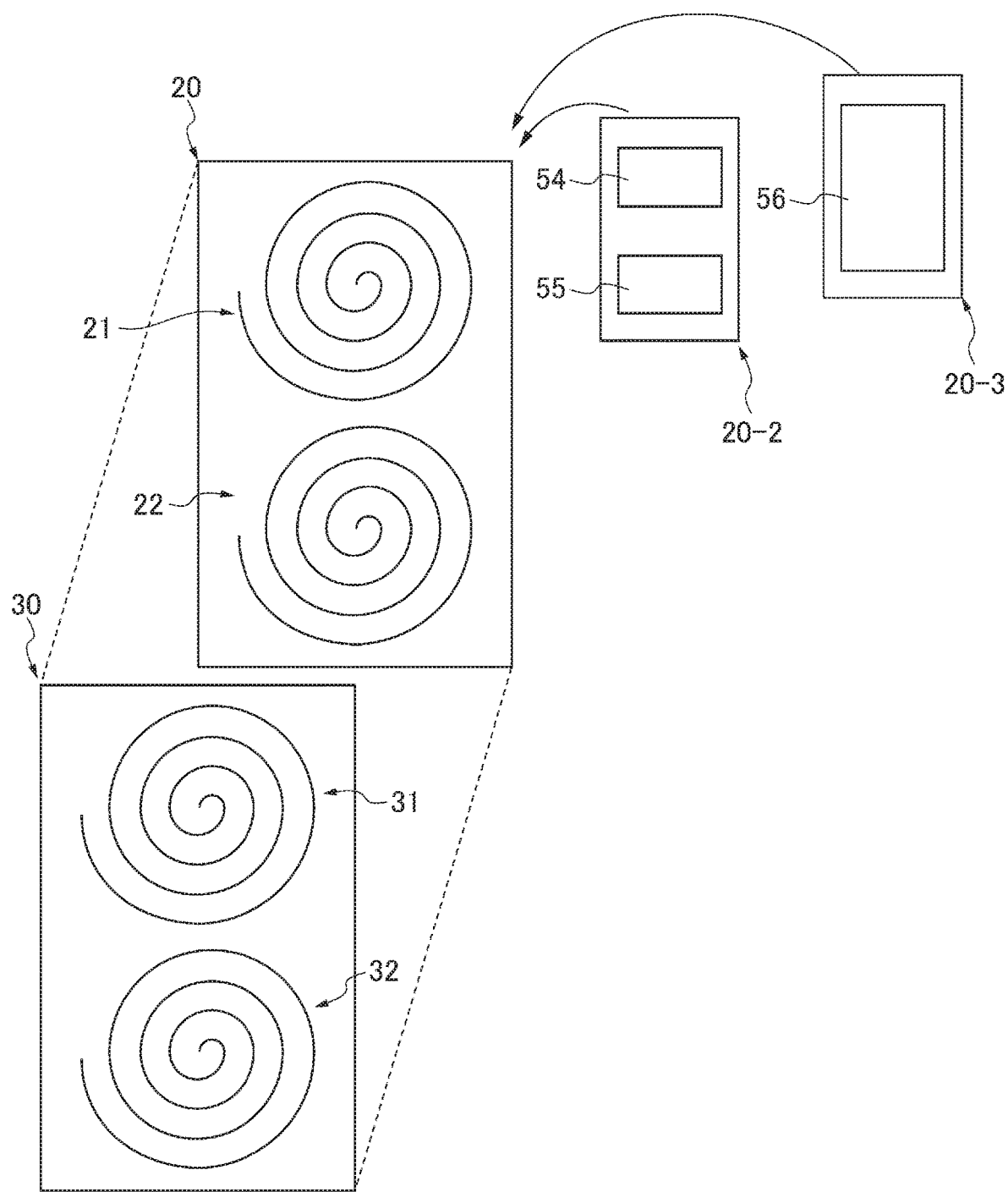
FIG. 16 is a schematic plan view showing a configuration example of a fifth modification of the key-side conductive unit and the sensor unit.

FIG. 16 is a schematic plan view showing a configuration example of a fifth modification of the key-side conductive unit 20 and the sensor unit 30. As shown in FIG. 16, each of the conductive units 21 and 22 and the signal output units 31 and 32 may be configured by a coil formed by a single spiral instead of two spirals. In addition, only one of the set of the conductive unit 21 and the signal output unit 31 and the set of the conductive unit 22 and the signal output unit 32 may be configured as a set of coils formed by a single spiral.

The key-side conductive unit is preferably a reactance element, but is not limited to an induction coil, and a conductive member may be used for the key-side conductive unit. For example, as for the key-side conductive unit, conductive metal plates 54 and 55 may be provided instead of the conductive units 21 and 22, as shown as a key-side conductive unit 20-2. The metal plates 54 and 55 are made of iron and the like. The metal plates 54 and 55 are plate members substantially parallel to the key pressing surface. When a distance of the metal plates 54 and 55 with respect to the signal output units 31 and 32 is changed, the capacitance of the signal output units 31 and 32 is changed, such that a signal having a magnitude corresponding to the distance can be extracted.

Alternatively, as shown as a key-side conductive unit 20-3, a single conductive metal plate 56 similar to the metal plates 54 and 55 may be provided instead of the conductive units 21 and 22. Even when the key-side conductive unit 20-2 or the key-side conductive unit 20-3 is used, the coil shapes of the signal output units 31 and 32 may be two spirals or a single spiral.

It is not essential to use the sum of the signals for the detection of the stroke position, and the stroke position may be detected based on only one of the pair of signal output units 31 and 32.

In each of the examples including the above-described modification, the signal output unit that outputs the signal corresponding to the distance from the corresponding key-side conductive unit 20 may be provided such that two or more signal output units correspond to each of the plurality of keys 13, and the number of signal output units is not limited to two. For example, two or more pairs of signal output units may be provided, and the displacement may be detected using signals from the respective pairs of signal output units. Alternatively, three signal output units may be disposed in the key arrangement direction, and the middle signal output unit may be dedicated to detecting the stroke position.

The operation detection device of the key of the present disclosure is not necessarily capable of detecting operations of all the keys 13 of the keyboard device 100, and may detect only some of the keys 13.

The outer shape of each of the spiral portions of the coils C21 and C31 constituting the conductive units 21 and 22 and the signal output units 31 and 32 is not limited to a circular shape, and may be an oval shape or a rectangular shape. Although the coils C21 and C31 are of a planar type, the coils C21 and C31 are not necessarily limited to a planar type as long as an arrangement space is allowed.

The present disclosure is not limited to the keyboard device 100, and is also applicable to a pedal, a keyboard for a personal computer, and the like.

In the present embodiment, the ones with "substantially" are not intended to exclude completeness. For example, "substantially parallel" and "substantially circular" are intended to include completely parallel and circular, respectively.

Embodiments of an operation detection method of a key operation of a keyboard device according to the present disclosure will be summarized below.

(1) According to an aspect of the present disclosure, an operation detection method of a key operation of a keyboard device is provided. The keyboard device includes: a plurality of keys; and a conductive unit disposed on each of the plurality of keys; a substrate disposed facing each of the plurality of keys in a pressing direction of the plurality of keys, and provided with: a sensor comprising at least first and second coils, the sensor being disposed spaced from one key, among the plurality of keys, so that at least one of the first or second coils outputs a signal corresponding to a distance between the one key and the respective sensor. The detection method includes detecting a displacement of the one key in at least one of a yaw direction or a roll direction based on signals output from the first and second coils in a key pressing stroke of the one key.

(2) The operation detection method according to (1) is provided. The operation detection method further includes detecting a stroke position of the one key based on the signal output from at least one of the first or second coils.

(3) The operation detection method according to (1) or (2) is provided. The operation detection method further includes detecting a stroke of the one key based on a sum of the signals output from the first and second coils. The operation detection method further includes detecting the displacement of the one key in the yaw direction or the roll direction based on a difference between the signals output from the first and second coils.

Although the present disclosure has been described in detail based on the preferred embodiments thereof, the present disclosure is not limited to these specific embodiments, and various aspects within the scope not departing from the gist of the present disclosure are also included in the present disclosure.

An operation detection device for a key operation of a keyboard device, an operation detection method of a key operation, and a keyboard device of the present disclosure can detect a displacement of a key in a yaw direction or a roll direction even during key pressing.

What is claimed is:

1. An operation detection device for a key operation of a keyboard device, the detection device comprising:
   a conductive unit configured to be disposed on each of a plurality of keys;
   a substrate configured to be disposed facing each of the plurality of keys in a pressing direction of the plurality of keys, and provided with:
      a sensor comprising at least first and second coils, the sensor being configured to be disposed spaced from one key, among the plurality of keys, so that at least one of the first or second coil outputs a signal corresponding to a distance between the one key and the respective sensor, in a state where the conductive unit is disposed on the one key and the respective substrate is disposed facing the one key; and
   a detection unit, including a processor, configured to detect a displacement of the one key in at least one of a yaw direction or a roll direction based on signals output from the first and second coils during a key pressing stroke of the one key.

2. The operation detection device according to claim 1, wherein the detection unit is configured to detect a stroke position of the one key based on the signal output from at least one of the first or second coils.

3. The operation detection device according to claim 1, wherein the detection unit is configured to:
detect the displacement of the one key in the yaw direction or the roll direction based on a difference between the signals output from the first and second coils.

4. The operation detection device according to claim 1, wherein the detection unit is configured to:
detect a stroke of the one key based on a sum of the signals output from the first and second coils.

5. The operation detection device according to claim 1, wherein the first and second coils are configured to be disposed along a key arrangement direction of the plurality of keys.

6. The operation detection device according to claim 5, wherein:
the first coil is configured to be disposed shifted in a first direction in the key arrangement direction with respect to the conductive unit, and
the second coil is configured to be disposed shifted in a second direction, opposite to the first direction, in the key arrangement direction with respect to the conductive unit.

7. The operation detection device according to claim 5, wherein:
the conductive unit comprises a third coil and a fourth coil, corresponding respectively to the first coil and the second coil, configured to be disposed in the key arrangement direction, and
in a plan view, a first relative inclination direction of the first coil with respect to the third coil is opposite to a second relative inclination direction of the second coil with respect to the fourth coil.

8. The operation detection device according to claim 1, wherein the first and second coils are configured to be arranged along a longitudinal direction of the one key.

9. The operation detection device according to claim 8, wherein the first coil is configured to be disposed shifted in a first direction along a key arrangement direction of the plurality of keys, and the second coil is configured to be disposed shifted in a second direction, opposite to the first direction, along the key arrangement direction.

10. The operation detection device according to claim 8, wherein:
the conductive unit comprises a third coil and a fourth coil, corresponding respectively to the first coil and the second coil, configured to be disposed along the longitudinal direction of the one key, and
in a plan view, a first relative inclination direction of the first coil with respect to the third coil is opposite to a second relative inclination direction of the second coil with respect to the fourth coil.

11. The operation detection device according to claim 1, wherein each of the first and second coils comprises:
two spiral portions connected to each other, and
the two spiral portions are spiralled in a same spiral direction as each other with a center of each of the two spiral portions as a base point.

12. The operation detection device according to claim 5, wherein:

each of the first and second coils comprises:
two spiral portions connected to each other,
the two spiral portions are spiralled in a same spiral direction as each other with a center of each of the two spiral portions as a base point, and
the spiral direction of one of the two spiral portions of the first coil and the spiral direction of one of the two spiral portions of the second coil adjacent to the one of the two spiral portions of the first coil that are adjacent to each other along the key arrangement direction are opposite of each other with the center of each of the spiral portions as the base point.

13. The operation detection device according to claim 1, wherein the conductive unit comprises a metal plate configured to be substantially parallel to a surface of the one key.

14. The operation detection device according to claim 1, wherein:
the conductive unit comprises a circuit including a coil comprising two spiral portions connected to each other, and
the two spiral portions in the conductive unit are spiralled in a same spiral direction with a center of each of the two spiral portions as a base point.

15. A keyboard device comprising:
a plurality of keys; and
an operation detection device for a key operation of the plurality of keys, and comprising:
a conductive unit disposed on each of the plurality of keys;
a substrate disposed facing each of the plurality of keys in a pressing direction of the plurality of keys, and provided with:
a sensor comprising at least first and second coils, the sensor being disposed spaced from one key, among the plurality of keys, so that at least one of the first or second coil outputs a signal corresponding to a distance between the one key and the respective sensor; and
a detection unit, including a processor, that detects a displacement of the one key in at least one of a yaw direction or a roll direction based on signals output from the first and second coils during a key pressing stroke of the one key.

16. An operation detection method of a key operation of a keyboard device comprising:
a plurality of keys; and
a conductive unit disposed on each of the plurality of keys;
a substrate disposed facing each of the plurality of keys in a pressing direction of the plurality of keys, and provided with:
a sensor comprising at least first and second coils, the sensor being disposed spaced from one key, among the plurality of keys, so that at least one of the first or second coils outputs a signal corresponding to a distance between the one key and the respective sensor,
where the detection method comprises detecting a displacement of the one key in at least one of a yaw direction or a roll direction based on signals output from the first and second coils in a key pressing stroke of the one key.

17. The operation detection method according to claim 16, further comprising detecting a stroke position of the corresponding key based on the signal output from the at least one of the first or second coil.

18. The operation detection method according to claim 16, wherein the detecting of the displacement detects the displacement of the one key in the yaw direction or the roll direction based on a difference between the signals output from the first and second coils.

19. The operation detection method according to claim 16, further comprising:
   detecting a stroke of the one key based on a sum of the signals output from the first and second coils.

\* \* \* \* \*